United States Patent [19]

Dalal et al.

[11] 3,847,700

[45] Nov. 12, 1974

[54] METHOD OF FORMING A MAGNET PATTERN ON MAGNETIC MEMORY CIRCUIT CARDS

[75] Inventors: Ajay P. Dalal, Chicago; Paul F. Elarde, Naperville; Frank A. Klasek, La Grange Park, all of Ill.

[73] Assignee: Western Electric Company, Incorporated, New York, N.Y.

[22] Filed: Nov. 17, 1972

[21] Appl. No.: 307,717

[52] U.S. Cl. ...................... 156/252, 29/604, 29/625, 156/261, 156/293, 156/298, 156/581

[51] Int. Cl. ........................... B32b 3/00, B41m 3/08

[58] Field of Search ........ 156/250, 251, 303.1, 293, 156/261, 233, 298, 234, 581, 252, 253; 174/68.5; 317/101; 29/625–627, 604, 609; 83/176

[56] References Cited

UNITED STATES PATENTS

| | | | |
|---|---|---|---|
| 3,678,577 | 7/1972 | Weglin et al. | 156/251 |
| 3,547,724 | 12/1970 | Zagusta | 156/233 |
| 3,301,730 | 1/1967 | Spiwalk et al. | 156/267 |

*Primary Examiner*—Charles E. Van Horn
*Assistant Examiner*—Michael W. Ball
*Attorney, Agent, or Firm*—R. A. Lloyd

[57] ABSTRACT

A thin sheet of magnetic material is placed across a malleable substrate and struck with a multiprojectioned punch. Each projection removes a wafer of the magnetic material from the sheet and embeds it into the substrate at a selected location. To ensure that the wafers remain on the substrate, a coating of adhesive may be applied to one side of the sheet of magnetic material and spaced between the material and the substrate during punching or, after punching, an adhesive may be applied across the wafer embedded surface of the substrate.

5 Claims, 4 Drawing Figures

METHOD OF FORMING A MAGNET PATTERN ON MAGNETIC MEMORY CIRCUIT CARDS

BACKGROUND OF THE INVENTION

1. Field of the Invention

The present invention relates to a method of forming a pattern of a first material on the surface of a malleable second material, and in particular to a method of forming and transferring a pattern of wafers of a magnetic material to embed the wafers into a surface of a malleable circuit card substrate.

2. Description of the Prior Art

In manufacturing magnetic memory cards, wafers of vicalloy are formed at preselected locations on a surface of a substrate, which is generally comprised of aluminum, and wires are then extended across the wafers to permit electrical pulses to "read" information stored on the wafers. Vicalloy is a generic term (p. 405, Ferromagnetism by Bozarth, 1st Ed. pub. 1951 by Van Norsten), used to designate those materials typically comprised of 52 percent cobalt, 37.25 percent iron, 10 percent vanadium, .050 percent manganese and .026 percent silicon, and is laminated on an aluminum substrate for manufacturing magnetic memory cards.

In a common manufacturing process a resist pattern, which outlines the wafers, or magnets, is applied by heretofore known techniques on the exposed vicalloy surface. During ensuing processing, approximately 92 percent of the vicalloy is dissolved in an aqueous etchant solution comprised of ammonium persulfate (a powerful oxidizing agent) highly acidified with sulfuric acid, for leaving a magnet pattern on the substrate. Except that the etched silicon will precipitate from the etchant in the form of silicon dioxide, the spent etchant will contain dissolved salts of all of the other foregoing metals of vicalloy.

Such a process for forming a vicalloy magnet pattern on a substrate has certain disadvantages. One such disadvantage, for example, is that the process of forming the magnet pattern, i.e., laminating, resist patterning and etching, is time consuming and expensive. Furthermore, the ammonium persulfate spent as etchant has an impurity concentration exceeding 5 parts per million, and must therefore be depurated to permit disposal in a sewer, again an expensive and time consuming procedure. Also, 92 percent of the vicalloy, a reasonably expensive material, is wasted.

To merely form a conductor pattern on a surface of an insulator, a known technique contemplates applying an adhesive to a sheet of the conductor and overlying the sheet, adhesive side down, on the surface of a heat softenable insulator, such as bakelite. The sheet of conductor material and the insulator are then pressed between heated dies which punch out the conductor pattern from the sheet of conductor material and soften the insulator material to permit the punched out conductor pattern to be pressed into the surface thereof.

This technique is slow, in that pressure must be applied by the heated dies for a time sufficient to soften the insulating material to allow the conductor pattern to be pressed therein, and the cost of the dies is increased since heating elements must be included therein. Furthermore, such a technique does not permit the use of an insulator which is not heat softenable.

SUMMARY OF THE INVENTION

In accordance with the present invention, a pattern of wafers of a magnetic material is formed on a surface of a malleable substrate by first overlying a sheet of the magnetic material on the surface of the substrate with the opposite surface of the substrate resting on a die having a plurality of apertures formed in accordance with the pattern for positioning the wafers. The sheet of magnetic material is then struck at an ambient temperature with a multiprojectioned punch to remove a wafer of magnetic material from the sheet with each projection and to embed the wafer into the substrate. The projections on the punch are in alignment with the apertures in the die, and the apertures in the die receive extruded portions of the substrate as the wafers are embedded therein. After embedding the wafers into the substrate, the wafer embedded substrate may be pressed between a pair of flat, heated plates, to straighten any bowing thereof resulting from the wafers being embedded therein, and a polyester film is applied over the wafer embedded surface of the substrate.

In another aspect of the invention, after embedding the wafers into the surface of the substrate, a sealer is applied across the wafer embedded surface to more firmly secure the wafers therein.

Other advantages and features of the invention will be apparent upon consideration of the following detailed description when taken in conjunction with the appended drawings.

DETAILED DESCRIPTION

Figure 1:
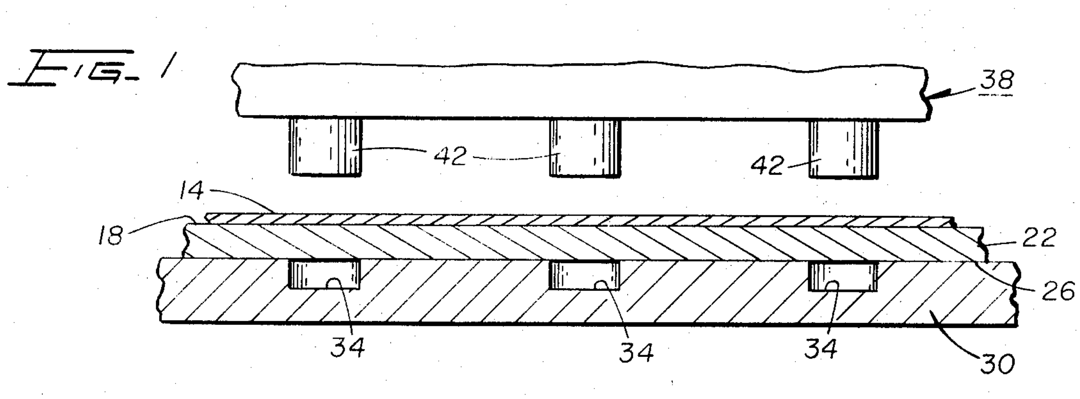
FIG. 1 is a cross-sectional view of a sheet of magnetic material overlying a malleable substrate, both of which are positioned between a punch and die.

Referring to FIG. 1 of the drawings, there is shown a flat, thin sheet of magnetic material 14 positioned across one surface 18 of a malleable substrate 22. The opposite surface 26 of the substrate 22 rests upon an unheated, or ambient temperature die 30 having a plurality of apertures 34 formed therein. Positioned above the sheet of magnetic material 14 is an unheated, or ambient temperature multiprojectioned steel punch 38 having projections 42 thereof in alignment with individual ones of the apertures 34 in the die 30. The punch 38 operates in response to actuation of a press (not shown) to form, as will be described, a pattern of wafers of the magnetic material 14 on the surface 18 of the substrate 22.

The substrate 22 may be of any malleable material, such as aluminum or epoxy glass, having a permeability which is insignificant with respect to the permeability of the magnetic material 14, and in the description of the invention will be regarded as being either an aluminum substrate or an epoxy glass substrate. The sheet of magnetic material 14 may be comprised, alternatively, of any material having a permeability which is high and significant with respect to the permeability of the substrate 22, and in the description of the invention shall be regarded as being a vicalloy material which is mainly comprised of cobalt, iron and vanadium with traces of manganese and silicon. Preferably, the die 30 is comprised of a malleable material such as brass, and the apertures 34 are formed therein by striking the die 30 with the steel projections 42 of the punch 38 without the sheet of magnetic material 14 and the substrate 22 being positioned therebetween.

The pattern of the projections 42 on the punch 38, which are preferably arranged in a matrix of rows and columns, determines the pattern of vicalloy wafers to be formed on the surface 18 of the substrate 22. To form the pattern of the vicalloy wafers on the surface 18, the unheated punch 38 is driven downward sufficiently to engage, with each projection 42, the thin sheet of vicalloy material 14, and to punch out and remove with each projection a wafer of the vicalloy material and to embed the wafer into the surface 18 of the malleable substrate 22. It is to be appreciated that the shape of the wafers removed by the punch 38 may be of any shape as determined by the configuration of the ends of the projections 42, and for the purpose of describing the invention shall be regarded as being circular. However, the wafers could have a square or triangular shape, the shape being mainly a matter of choice.

Figure 2:
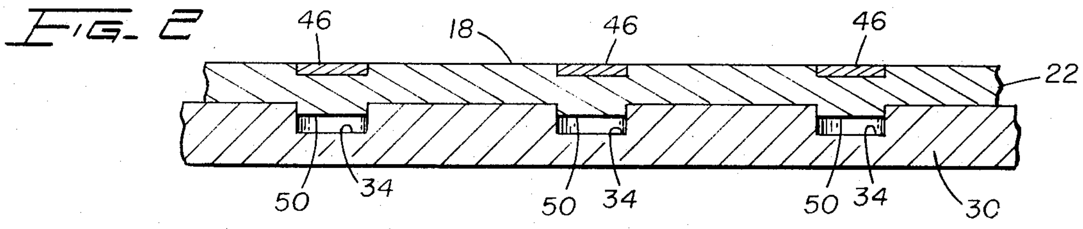
FIG. 2 is a cross-sectional view of the substrate with wafers of the magnetic material embedded therein by the punch shown in FIG. 1.

As shown in FIG. 2, a plurality of wafers 46 of the magnetic material, or vicalloy 14, have been embedded into the surface 18 of the malleable substrate 22. Preferably, each wafer is embedded into the substrate 22 with the upper surface of the wafer flush, or in a coplanar relationship, with the surface 18. If a wafer is embedded below flush, it may exhibit a low gauss reading in response to a signal on a "read" wire (not shown), extended across the upper surface of the wafer in the final assembly of a magnetic memory circuit card, as a result of the wafer having too great a spacing from the wire. If the wafer is embedded above flush, it may not be embedded firmly enough into the substrate to remain within the substrate during subsequent handling of the substrate.

During the punching and embedding operation the apertures 34, each of which are in alignment with a different one of the projections 42 on the punch 38, receive a portion 50 of the substrate 22 which is extruded therein as a result of the displacement of the overlying substrate material as the wafers 46 are embedded into the substrate. By receiving the portions 50 of the substrate 22 witiin the apertures 34, a mushroom or ridge formation of the substrate 22 is prevented from welling up around the periphery of the wafers 46 as they are embedded into the substrate, which ridges could cause a wafer, when a "read" wire is extended thereacross, to exhibit a low gauss reading in the same manner as if the wafers were embedded below flush. That is, with a ridge formation around the periphery of the wafers 46, a wire extended thereacross might not be able to be spaced sufficiently close to the wafer to permit a required minimum gauss reading to be obtained therefrom.

Figure 3:
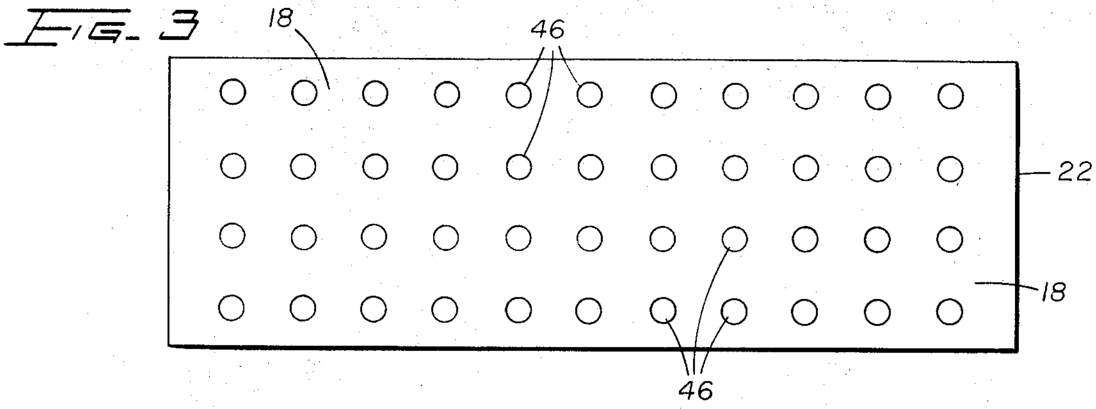
FIG. 3 is a top view of the substrate after the wafers of magnetic material have been embedded therein.

FIG. 3 shows a typical pattern of individual, uniform size vicalloy wafers 46 formed at the intersections of rows and columns on the surface 18 of the substrate 22 after being operated upon by the punch 38 and the die 30. Normally, the compressive force of the substrate material surrounding the periphery of the embedded wafers 46 is sufficient to maintain the wafers within the substrate 22. However, during subsequent handling the flexing of the substrate, it is possible that one or more of the wafers 46 may be released from the surface of the substrate. To ensure that the wafers 46 are retained within the substrate 22, a coating of epoxy resin may be applied across the surface 18 after the wafers 46 have been embedded coplanar therewith to seal the wafers 46 in the substrate 22. Alternatively, prior to punching wafers 46 from the sheet of magnetic material 14, a coating of epoxy resin, or other suitable adhesive, may be applied to one surface of the sheet of magnetic material. Then, when the epoxy resin coating is substantially dry, but not completely cured, the sheet of magnetic material 14 may be placed across the surface 18 of the substrate 22, with the epoxy resin coating spaced between the sheet 14 and the surface 18, and wafers thereof embedded into the substrate 22. After embedding the wafers 14 into the substrate 22, the continued hardening, or curing, of the epoxy resin secures the individual wafers 46 to the substrate.

Figure 4:
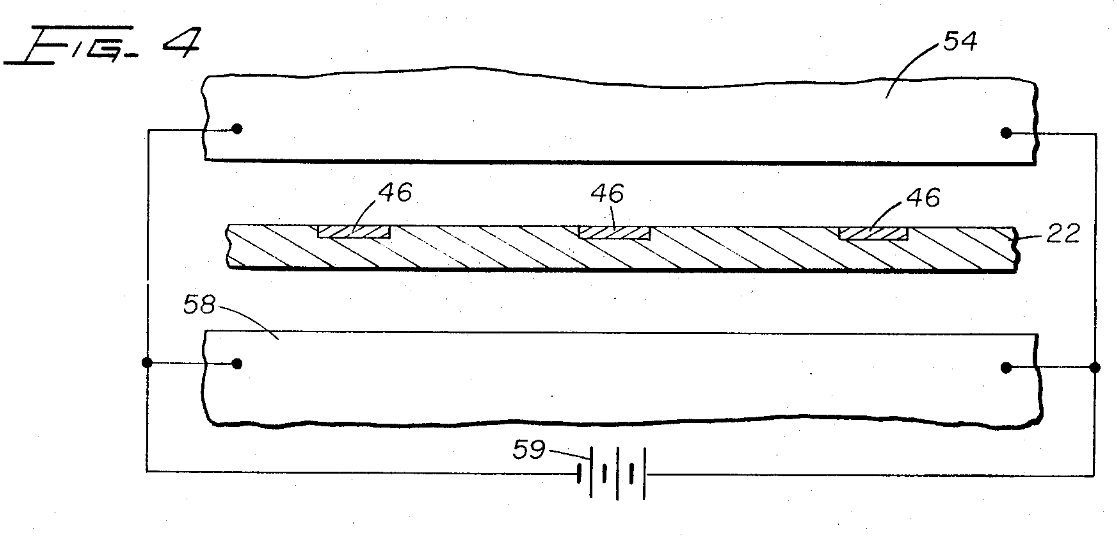
FIG. 4 shows the wafer embedded substrate positioned between a pair of flat, heated plates.

If the substrate 22 is an epoxy glass substrate, embedding the wafers 46 therein introduces stresses within the substrate which tend to bow the substrate. To straighten the substrate 22 from its bowed condition after the wafers 46 are embedded therein, the substrate may be placed, as shown in FIG. 4, between a pair of movable heated plates 54 and 58 and pressed therebetween. The plates 54 and 58 are resistance heated, by a source of power 59, to a sufficient temperature to partially flow the epoxy glass substrate pressed therebetween to relieve the stresses within the substrate and to permit the substrate to return to its original flat, nonbowed configuration. Furthermore, if the substrate 22 is of the epoxy glass variety, a non-hardened, heat curable epoxy resin may be included as part of its composition. Then, when the substrate is straightened between the heated plates 54 and 58, the heat of the plates 54 and 58 will cure the epoxy resin to secure the wafers 46 to the substrate 22. Thereafter, a layer of pressure sensitive polyester film is applied over the surface 18 to additionally ensure that the wafers 46 remain within the substrate 22.

Normally, in the fabrication of a magnetic memory circuit card, the wafers 46 on the surface 18 of the substrate 22 cover approximately 8 percent of the total area of the surface 18. Therefore, if the sheet of magnetic material 14 has approximately the same surface area as the surface 18, when the punch 38 removes the wafers 46 from the sheet of magnetic material only 8 percent of the magnetic material is removed. To avoid wasting the remaining 92 percent of the sheet 14, the sheet may be sequentially positioned across the surfaces 18 of additonal substrates 22 such that a virgin area of the sheet is presented to the projections 42 upon each operation of the punch 38. In this manner, additional wafers 46 may be obtained from the sheet 14 to optimize the number of substrates 22 which may receive wafers 46 from a single sheet of magnetic material 14.

While several embodiments of the invention have been described in detail, it is to be understood that other modifications and embodiments may be devised by one skilled in the art without departing from the spirit and scope of the invention. What is claimed is:

1. In a method of compressively securing a pattern of magnetic material wafers in a surface of a malleable substrate having a magnetic permeability which is insignificant with respect to the permeability of the wafers:

overlying a sheet of magnetic material in direct contact with a first surface of the substrate;
positioning the opposite surface of the substrate on a rigid die having a plurality of apertures formed therein in accordance with the wafer pattern, and striking at ambient temperature the sheet of magnetic material with a punch to remove a plurality of wafers of magnetic material from the sheet, to displace the material of the substrate and embed the wafers into the first surface of the substrate and to secure the wafers therein by deforming the substrate to compressively surround the edges of the wafers, the apertures in the die receiving extruded portions of the opposite surface of the substrate beneath the wafers as the wafers are embedded into the first surface thereof.

2. In a method as set forth in claim 1, further comprising:
applying a sealer across the wafer embedded surface of the substrate to more firmly secure the wafers therein.

3. In a method as set forth in claim 1, wherein the malleable substrate is an epoxy glass substrate, further comprising:
pressing the wafer embedded substrate between a pair of flat, heated plates, to straighten any bowing thereof.

4. In a method as set forth in claim 2, further comprising:
applying a polyester film over the wafer embedded surface of the substrate.

5. In a method of manufacturing a circuit card of the type wherein a circuit pattern of a metallic material is compressively secured in a surface of a deformable carrier material:
placing the carrier material between an ambient temperature punch having a raised pattern in the form of the circuit pattern, and a rigid, ambient temperature, planar die having apertures formed therein in the form of the circuit pattern and in alignment with the corresponding raised pattern of the punch for cooperation therewith;
positioning a sheet of the metallic material in direct contact with a first surface of the carrier material between the punch and the carrier material, and
moving the punch and the die relative to and toward each other to apply the pattern of the punch against the sheet of metallic material to cut the circuit pattern therefrom as the sheet is pressed between the pattern of the punch and the carrier, to embed the circuit pattern of metallic material into and flush with the surface of the carrier and to secure the circuit pattern therein by deforming the carrier material to compressively surround the edges of the circuit pattern, and to extrude sufficient portions of the opposite surface of the carrier material, underlying the embedded circuit pattern of metallic material, into the apertures formed in the die, so that the carrier material surrounding the metallic pattern remains essentially flush with the upper surface of the circuit pattern.

* * * * *